(12) United States Patent
Kneringer et al.

(10) Patent No.: US 6,914,330 B2
(45) Date of Patent: Jul. 5, 2005

(54) HEAT SINK FORMED OF DIAMOND-CONTAINING COMPOSITE MATERIAL WITH A MULTILAYER COATING

(75) Inventors: Günter Kneringer, Wängle (AT); Arndt Lüdtke, Ehenbichl (AT)

(73) Assignee: Plansee Aktiengesellschaft, Reutte (AT)

( * ) Notice: Subject to any disclaimer, the term of this patent is extended or adjusted under 35 U.S.C. 154(b) by 92 days.

(21) Appl. No.: 10/669,073

(22) Filed: Sep. 23, 2003

(65) Prior Publication Data

US 2004/0157089 A1 Aug. 12, 2004

(30) Foreign Application Priority Data

Sep. 23, 2002 (AT) ........................................ GM629/2002

(51) Int. Cl.[7] .............................................. H01L 23/34
(52) U.S. Cl. ....................................... 257/712; 257/707
(58) Field of Search ................................ 361/688, 704, 361/705, 708–711, 714; 257/706, 707, 712

(56) References Cited

U.S. PATENT DOCUMENTS

| | | | | |
|---|---|---|---|---|
| 3,924,031 A | * | 12/1975 | Nicholas et al. | ............ 427/217 |
| 5,008,737 A | * | 4/1991 | Burnham et al. | ........... 257/712 |
| 5,055,424 A | * | 10/1991 | Zeidler et al. | ............... 438/105 |
| 5,120,495 A | * | 6/1992 | Supan et al. | ................... 419/11 |
| 5,273,790 A | | 12/1993 | Herb et al. | |
| 5,388,027 A | * | 2/1995 | Pollock et al. | ............... 361/705 |
| 5,392,982 A | * | 2/1995 | Li | ............................ 228/124.5 |
| 5,451,352 A | * | 9/1995 | Cook | ......................... 264/102 |
| 5,559,817 A | * | 9/1996 | Derkits et al. | ................ 372/36 |
| 5,804,321 A | * | 9/1998 | Thorpe et al. | .............. 428/623 |
| 6,211,463 B1 | * | 4/2001 | Fabis | ......................... 174/52.5 |
| 6,727,117 B1 | * | 4/2004 | McCoy | ....................... 438/106 |
| 6,830,780 B2 | * | 12/2004 | Petkie | ..................... 427/255.7 |
| 2003/0183368 A1 | * | 10/2003 | Paradis et al. | ............. 165/80.3 |

FOREIGN PATENT DOCUMENTS

| | | |
|---|---|---|
| EP | 0 450 968 A2 | 10/1991 |
| EP | 0 637 076 B1 | 2/1995 |
| EP | 1 143 044 A1 | 10/2001 |
| GB | 2 311 539 A | 10/1997 |
| JP | 11 243 168 A | 9/1999 |
| WO | 99/12866 | 3/1999 |

* cited by examiner

*Primary Examiner*—David A. Zarneke
(74) *Attorney, Agent, or Firm*—Laurence A. Greenberg; Werner H. Stemer; Ralph E. Locher

(57) ABSTRACT

A module serves as a heat sink for semiconductor components. The module includes a diamond/composite substrate that carries a multilayer coating on at least one substrate surface and a housing frame made from ceramics which is soldered onto the substrate. The module excellently fulfills the demands imposed on it, namely a good ability for areally joining to the semiconductor component, a high heat transfer through the joining zone and a good electrical conductivity of the module in the joining zone.

10 Claims, 1 Drawing Sheet

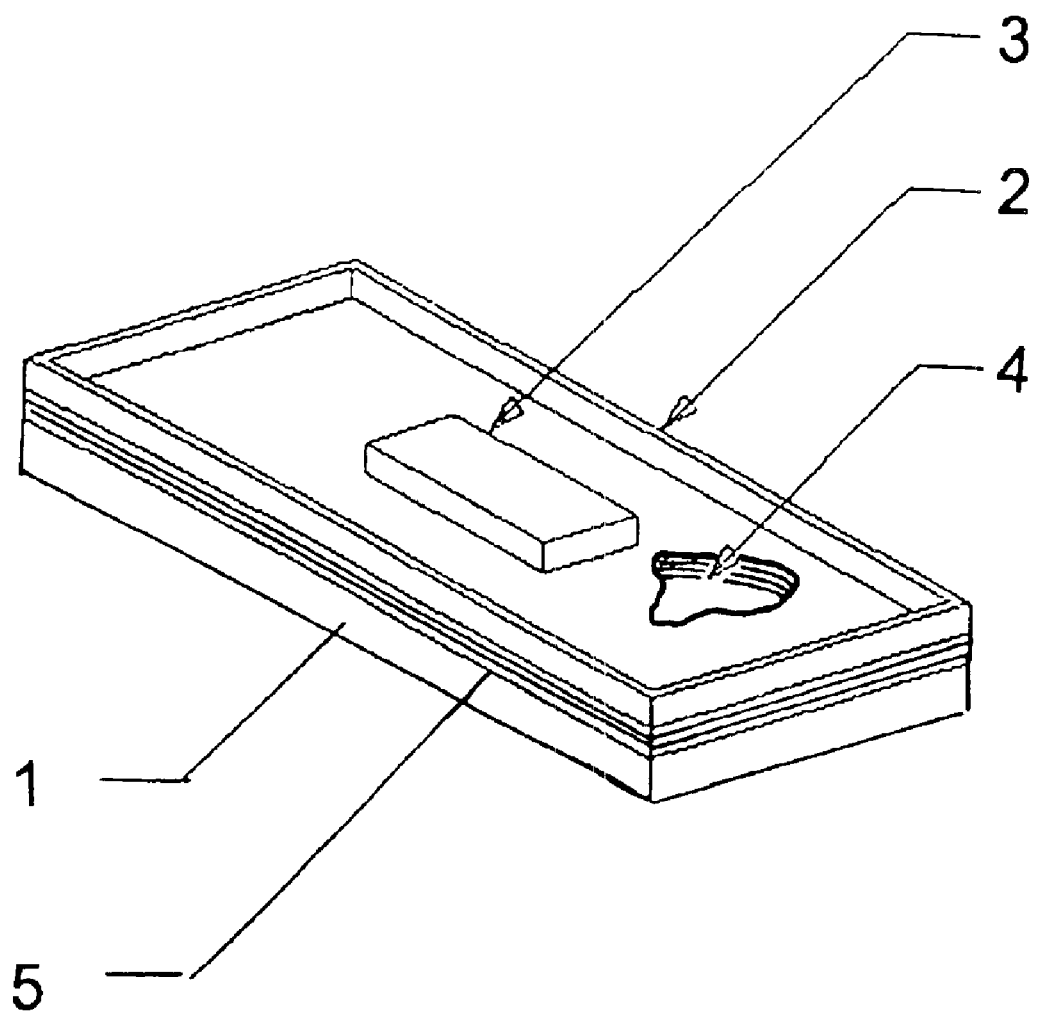

HEAT SINK FORMED OF DIAMOND-CONTAINING COMPOSITE MATERIAL WITH A MULTILAYER COATING

BACKGROUND OF THE INVENTION

Field of the Invention

The invention relates to a module forming a heat sink for semiconductor components. The module is composed of a flat-surfaced substrate, and is formed of a diamond composite material containing 40 to 90% by volume of diamond. A ceramic housing frame is areally joined to it in its edge zones.

Electronic semiconductor components have an ever increasing number of functional units on an ever smaller space, produced at ever higher production rates. They therefore increasingly produce greater amounts of heat. The heat content has to be dissipated in order to avoid malfunctions in the chip.

This applies in particular also to electronic modules, such as laser diodes, LDMOSs (laterally diffused metal oxide semiconductors), HFADs (high frequency amplifier devices) and to other chips used in telecommunications equipment.

To improve the dissipation of heat from the chip, the latter is usually applied, preferably by cohesive joining, for example soldering, areally to a planar substrate of high thermal conductivity.

An areal composite with good bonding and disruption-free functioning of the chip are ensured all the more successfully the more closely the specific coefficients of thermal expansion of the chip material and substrate material correspond to or approach one another.

On account of the similarity of their coefficients of thermal expansion to those of the chip materials which are customary, heat sinks based on W and Mo are used, generally in combination with metals of good electrical and thermal conductivity, such as for example Cu. Alternatively, and taking particular account of the substantial absence of distortion, layer composites, for example a Cu—MoCu—Cu composite of high thermal and electrical conductivity, are used.

In view of the increasing demands imposed on the thermal conductivity of such heat sinks, consideration has more recently been given to the excellent properties of diamond, for cost reasons in the form of shaped bodies pressed from diamond grains or in the form of diamond layers deposited from the vapor phase on a material of good conductivity.

For an electronic component to function, it is nowadays indispensable for its base surface, which has been joined to the heat sink, to be held at a predetermined electrical potential, for example to be well grounded. However, this requires good electrical conductivity of the heat sink material, at least in the region of the surface where it is joined to the chip, a condition which is not satisfied by the material diamond.

Accordingly, there has been no lack of attempts, hitherto with little success, either to make the shaped body of compacted diamond itself sufficiently electrically conductive, without at the same time unacceptably increasing the coefficient of thermal expansion, or alternatively, in accordance with failed tests, to provide diamond shaped bodies with electrically conductive metal layers which bond well to them.

Examples of the above are to be found in the patent literature. For example, published European patent application EP 1 143 044 A1 describes a substrate material consisting of a shaped body of diamond which has been provided with a SiC layer on the surface. The SiC layer has a significantly lower thermal conductivity than the diamond shaped body and therefore adversely affects the quality of the composite as a heat sink.

British patent GB 2 311 539 B likewise describes, as a heat sink for electrical components, a metallic substrate which has been provided with a diamond layer, preferably deposited from the vapor phase, and wherein the substrate metal used was W, Mo, W—Cu or W—Ag. To form a diamond layer which functions appropriately, this layer has to be of relatively thick design. Thick layers lead to uncontrollable and intolerable distortion of the substrate surface.

U.S. Pat. No. 5,273,790 describes a diamond composite material having a thermal conductivity of >1700 W/(mK), wherein diamond particles that have been loosely shaped are converted into a stable shaped body by means of the subsequent deposition of diamond from the vapor phase. This is referred to in the prior art document as infiltration. The diamond composite produced in that way, however, is too expensive for commercial use in mass-produced parts.

International PCT publication WO 99/12866 describes a process for producing a diamond/SiC composite material which is practically nonconductive. For it to be useable as a material for heat sinks, i.e. for it to be made conductive, it was attempted to provide the shaped body with metal layers, for example with Cu or Au. On account of the altogether inadequate layer adhesion, however, that composite material has not to date been used in heat sinks for semiconductor components.

To stabilize the geometric dimensions of highly thermally loaded heat sinks in plate form, it is customary for a housing frame to be applied cohesively in the edge region. This measure serves to protect the composite substrate from distortion or surface curvature as a result of the thermomechanical stresses which inevitably occur. Without this supporting frame, in previously known module embodiments high fluctuating thermomechanical loads have led to material distortion and loss of the cohesive bond between chip and substrate. Hitherto, $Al_2O_3$ has been virtually the only material used for the frame material, on account of its low coefficient of thermal expansion and the good practical results in terms of its solderability to the materials which have previously been used for the substrate. However, $Al_2O_3$ cannot be permanently cohesively bonded to diamond material and is therefore not suitable as a material for a housing frame on diamond substrates.

SUMMARY OF THE INVENTION

It is accordingly an object of the invention to provide a module which is provided as a heat sink and which overcomes the above-mentioned disadvantages of the heretofore-known devices and methods of this general type and which has a material or material composite which, with regard to the combination of thermal and electrical conductivity, is superior to the materials which have been disclosed hitherto, wherein the component surface is not subject to any distortion or is subject to so little distortion that permanent cohesive bonding to the semiconductor chip is possible and the cohesive configuration of the indispensable housing frame is ensured.

With the foregoing and other objects in view there is provided, in accordance with the invention, a module forming a heat sink for semiconductor components, comprising:

a flat-surfaced substrate formed of a diamond composite material containing:

from 40 to 90% by volume of diamond;

a multilayer, metallic coating applied to the substrate, the coating having a first layer containing a carbide-forming metal, and at least one second layer predominantly comprising at least one metal selected from the group consisting of Cu, Ni, Ag, and Au; and a ceramic housing frame areally joined to edge zones of the substrate, and soldered onto the substrate having been provided at least with the first layer.

In accordance with an added feature of the invention, the first layer, containing carbide-forming metal, has a thickness of <2 µm.

In accordance with an additional feature of the invention, the module is formed with a surface having regions configured for a semiconductor chip to be areally soldered to.

In accordance with another feature of the invention, the first layer contains at least one metal selected from the group consisting of Ti, Zr, Hf, V, Nb, and Ta.

In accordance with a further feature of the invention, the diamond composite substrate with the coating has a thermal conductivity, perpendicular to the coating layers, of >300 W/(mK).

In accordance with again an added feature of the invention, the coating is formed with a layer sequence Ti, Ni, Au.

In accordance with again another feature of the invention, the first layer is applied as a solder layer.

In accordance with a concomitant feature of the invention, the first layer is a vapor-deposited layer.

Other features which are considered as characteristic for the invention are set forth in the appended claims.

Although the invention is illustrated and described herein as embodied in a heat sink made from diamond-containing composite material with a multilayer coating, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWINGS

The FIGURE is a perspective view of a module that can be used as a heat sink, carrying a semiconductor component of standard configuration on it.

DESCRIPTION OF THE PREFERRED EMBODIMENTS

Referring now to the sole FIGURE of the drawing in detail, there is shown a module which can be used as a heat sink, already with a semiconductor component of standard configuration applied to it. A multilayer metallic coating 5 has been applied in layers to the entire area of a substrate made from a diamond-containing composite material 1 with a planar surface 4. A continuous housing frame 2 has been soldered to the edge region of the composite substrate provided with the coating.

A semiconductor component 3 has been applied areally (i.e., flat surface-to-surface) to the component which has been completed to this degree. The electrical supply conductors leading to the semiconductor component and the housing cover, which is usually applied to the housing frame in an airtight manner and covers the entire surface of the frame, are not illustrated for purposes of clarity.

The materials structure of the module according to the invention is accordingly tailored to a three-dimensional design of the complete semiconductor module corresponding to the outline illustration presented in the figure.

The advances or advantages over the known prior art as set out in the description relating to the object result, for this type of complete semiconductor modules using the module according to the invention. The restricted group, in accordance with the invention, has only a low electrical conductivity and a particularly high thermal conductivity. The diamond composite shaped body according to the invention at the same time brings with it the required conditions for good, permanent cohesive bonding to a surface layer, which must be of excellent electrical conductivity, in the form of the coating, which is primarily important to the invention. The housing frame made from ceramics can be soldered in a gastight and permanent manner without distortion to this coating and/or to just the first layer of the coating.

The later case precludes the second layer from being formed in the soldered surfaces of substrate and frame. Therefore, the substrate only has the second layer in partial regions of its surface.

Forming the first layer on what will subsequently be the soldering surfaces between substrate and frame entails significant advantages for the component with regard to the mechanical strength of the soldering surfaces and protection of the substrate from undesired contamination by the soldering material.

A semiconductor component which has been cohesively applied to a module of this type has the desired permanent bonding with a high electrical conductivity in the entire region of the joining surface and with a high specific dissipation of heat from the semiconductor component into the diamond-containing substrate.

The module according to the invention can be produced at relatively low cost and can therefore be used in electronic modules employed as mass-produced parts.

Suitable substrate materials are diamond/silicon carbide, diamond/silver and diamond/copper composite materials with a diamond content of 40 to 90% by volume.

The first layer of the coating, which contains a carbide-forming metal, may alternatively be formed by application of an active brazing alloy or by means of one of the known vapor deposition processes, such as CVD (chemical vapor deposition) or PVD (physical vapor deposition). In any event, it must be ensured, by applying suitable temperatures to the substrate surface, that carbides are formed, at least in an interfacial region. The carbon required originates at least predominantly from the diamond composite substrate.

In particular the metals Ti, Zr, Hf, V, Nb, and Ta and their alloys have proven to be suitable as carbide-forming metals whose carbides are stable even at relatively high temperatures. Titanium plays a major role in this context. The first layer serves as a bonding agent and generally has only a moderate thermal and electrical conductivity. For these reasons, it should advantageously be limited to thicknesses of <2 µm, preferably to thicknesses of less than 1 µm. The finished layer in many cases has a structure of graduated composition, with the highest carbide concentration in a zone which directly adjoins the interface with the substrate.

Following the first layer, the module has a second layer or even a plurality of layers made from metals of good electrical conductivity, such as for example Cu, Ni, Ag or Au or alloys thereof with one another or with third metallic components. These layers are preferably deposited by electrodeposition or by way of PVD processes. If the layer material that is employed is gold, the material is applied in particular as a relatively thin, outer layer to a relatively thick second and optionally third layer. The layer sequence comprising Ti-containing layer, Ni layer, Au layer has proven particularly suitable.

The housing frame made from ceramics can be soldered in a gastight manner onto the composite substrate which has been provided with a coating. Then, the electrical contact lugs for individual surface regions of the semiconductor component are to be attached to the frame outer surface. The frame in this case serves as a mechanical support for the contact lugs. AlN has proven suitable for the housing frame, on the one hand because its coefficient of thermal expansion is more well matched to that of the diamond composite material, and on the other hand on account of its good soldering properties. The housing frame is alternatively either soldered onto the completed coating or directly onto the first coating layer. In the latter case, the second and any further coating layers are only applied after the housing frame has been soldered on, generally only in the surface region of the substrate which is enclosed by the housing.

The invention is described in more detail on the basis of the exemplary embodiment below.

EXAMPLE

A Ti-containing active brazing alloy having a composition comprising 3% by weight of Ti, 27% by weight of Cu, remainder Ag was applied in the form of a foil to a substrate consisting of 50% by volume of diamond, 45% by volume of silicon carbide and a total free silicon and amorphous carbon content of approximately 5% by volume, with a density of 99.98%. The substrate was areally wetted with the brazing alloy by means of a heat treatment at 850° C. The diamond composite substrate which had been coated with active brazing alloy was then electroplated with a 2 $\mu$m thick copper layer and then a 1 $\mu$m thick gold layer. This ensured the required electrical back-contact for a semiconductor component which was subsequently to be applied.

Then, a AlN housing frame was soldered onto the diamond/silicon carbide substrate coated with titanium solder, copper and gold at a temperature of 780° C.

The module produced in this way as a heat sink for semiconductor components has an electrically conductive and solderable surface which adheres particularly well at temperatures of up to 800° C. A resulting thermal conductivity of approx. 400 W/(mK) in the contact or joining surface between substrate and semiconductor component and a coefficient of thermal expansion of 3 ppm/K were determined by means of a suitable measuring arrangement.

It should be readily understood that the invention is not restricted to the specific embodiments described in the description and in the example.

The above description and the following claims are based on Austrian application GM 629/2002, the international priority is claimed under 35 U.S.C. § 119. In addition, the Austrian document is herewith incorporated by reference in its entirety.

We claim:

1. A module forming a heat sink for semiconductor components, comprising:
    a flat-surfaced substrate formed of a diamond composite material containing from 40 to 90% by volume of diamond;
    a multilayer, metallic coating applied to said substrate, said coating having a first layer containing a carbide-forming metal, and at least in part of the substrate surface at least one second layer predominantly comprising at least one metal selected from the group consisting of Cu, Ni, Ag, and Au; and
    a ceramic housing frame areally joined to edge zones of said substrate, and soldered onto said substrate having been provided at least with said first layer.

2. The module according to claim 1, wherein said first layer, containing carbide-forming metal, has a thickness of <2 $\mu$m.

3. The module according to claim 1 formed with a surface having regions configured for a semiconductor chip to be areally soldered to.

4. The module according to claim 1, wherein said diamond composite substrate contains at least one component selected from the group SiC, Ag, Au, Al and Cu.

5. The module according to claim 1, wherein said first layer contains at least one metal selected from the group consisting of Ti, Zr, Hf, V, Nb, and Ta.

6. The module according to claim 1, wherein said diamond/composite substrate with said coating has a thermal conductivity, perpendicular to said coating layers, of >300 W/(mK).

7. The module according to claim 1, wherein said coating is formed with a layer sequence Ti, Ni, Au.

8. The module according to claim 1, wherein said first layer is applied as a solder layer.

9. The module according to claim 1, wherein said first layer is a vapor-deposited layer.

10. The module according to claim 1, wherein said ceramic housing frame is made of AlN.

* * * * *